United States Patent [19]
Nakamura

[11] Patent Number: 5,338,956
[45] Date of Patent: Aug. 16, 1994

[54] ELECTRICALLY ERASABLE AND PROGRAMMABLE READ ONLY MEMORY HAVING A THIN FILM TRANSFERRING TRANSISTOR OVER A FLOATING GATE MEMORY TRANSISTOR

[75] Inventor: Akihiro Nakamura, Tokyo, Japan
[73] Assignee: Sony Corporation, Tokyo, Japan
[21] Appl. No.: 863,712
[22] Filed: Apr. 3, 1992
[30] Foreign Application Priority Data
  Apr. 5, 1991 [JP] Japan .................. 3-102110
[51] Int. Cl.⁵ ............ H01L 29/68; G11C 11/40
[52] U.S. Cl. ................ 257/316; 257/322; 257/67; 257/408; 365/185
[58] Field of Search ............ 257/67, 66, 69, 70, 257/315, 316, 322; 365/185

[56] References Cited
U.S. PATENT DOCUMENTS

| | | | |
|---|---|---|---|
| 4,476,475 | 10/1984 | Naem et al. | 257/70 |
| 4,667,217 | 5/1987 | Janning | 257/67 |
| 4,939,690 | 7/1990 | Momodomi et al. | 365/185 |
| 4,959,812 | 9/1990 | Momodomi et al. | 365/185 |
| 4,996,669 | 2/1991 | Endoh et al. | 365/185 |
| 5,191,551 | 3/1993 | Inoue | 257/316 |

FOREIGN PATENT DOCUMENTS
1-251759 10/1989 Japan .................. 365/185

OTHER PUBLICATIONS
Sze, S. M. "Semiconductor Devices –Physics and Technology" c. 1985 by Bell Telephone Lab Inc., p. 490.

Primary Examiner—Robert Limanek
Attorney, Agent, or Firm—Hill, Steadman & Simpson

[57] ABSTRACT

The present invention is intended to relax restrictions on threshold voltage for a nonvolatile storage device, such as a flash EEPROM and to enable a nonvolatile storage device to be constructed in a higher degree of integration. A plurality of nonvolatile memory cells (4) having floating gates (14) and control gates (17) formed over the floating gates (14) are connected in series through source-drain regions (22) between the data output terminal and the reference voltage terminal of data lines (38, 39). Channel forming regions (33) are formed on a gate insulating film (31) formed over the control gates (17). The source-drain regions 34 of thin-film transistors are connected to the opposite sides of the channel forming regions (33) and the source-drain regions (22), respectively.

1 Claim, 7 Drawing Sheets

ELECTRICALLY ERASABLE AND PROGRAMMABLE READ ONLY MEMORY HAVING A THIN FILM TRANSFERRING TRANSISTOR OVER A FLOATING GATE MEMORY TRANSISTOR

BACKGROUND OF THE INVENTION

1. Field of the Invention

The present invention relates to a nonvolatile storage device, such as a flash EEPROM and, more particularly, to a high-density storage device comprising memory cells connected in series.

2. Description of the Prior Art

An EEPROM (electrically erasable and programmable ROM) such as disclosed in Japanese Patent Laid-open (Kokai) No. Hei 2-112286 can be programmed and erased repeatedly. In programming this EEPROM, the program stored in the EEPROM need not be erased by irradiation with ultraviolet light and data stored in the EEPROM can be erased or data can be written in the EEPROM by electric signals. Such read/write possibility of the EEPROM is available for memory cards.

Figure 1:
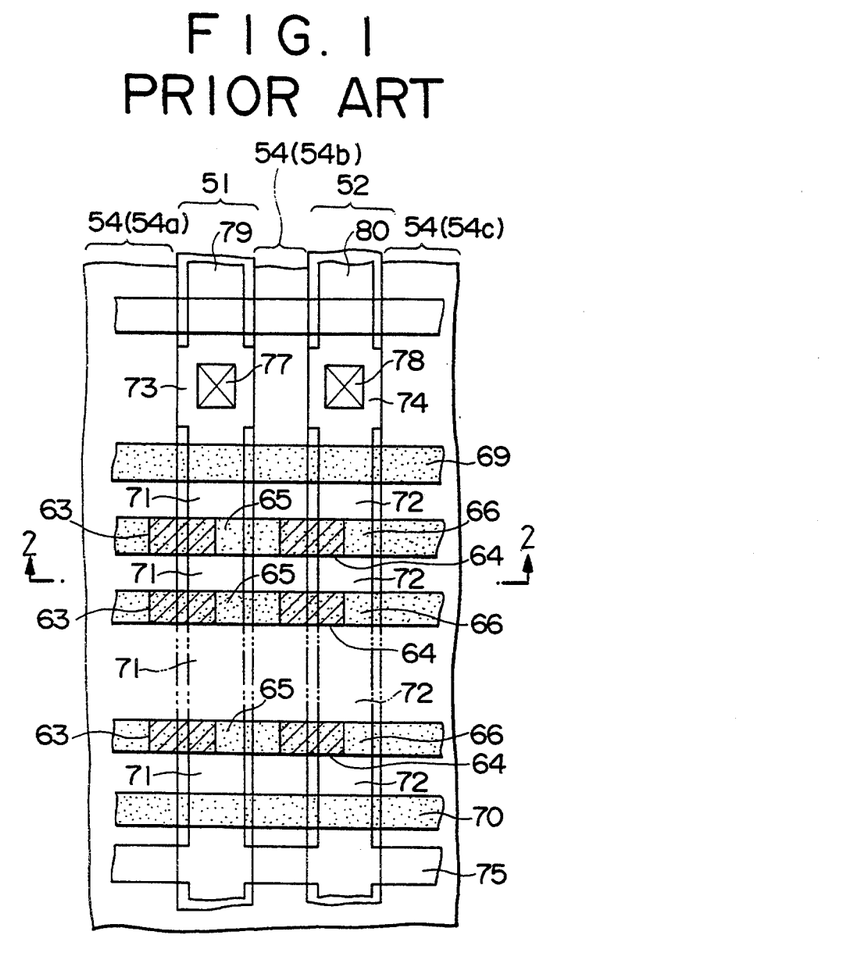
FIG. 1 is a plan view showing the layout of the components of a conventional EEPROM.
Figure 2:
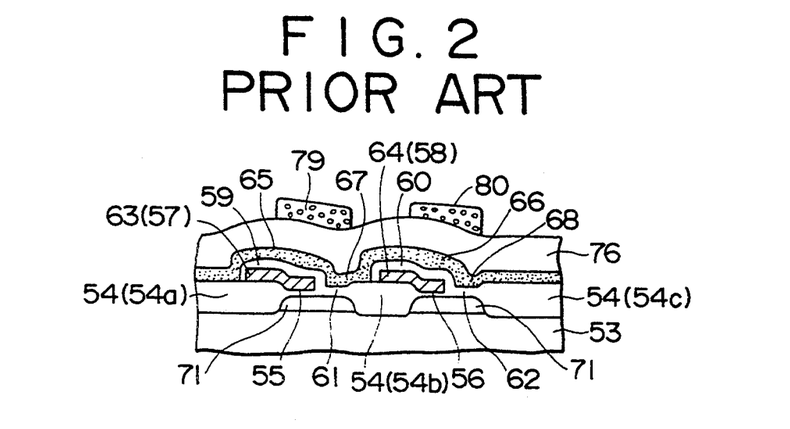
FIG. 2 is a schematic sectional view taken on line 2—2 in FIG. 1.

The EEPROM will be described with reference to FIGS. 1 and 2 showing a flash EEPROM comprising NAND type basic blocks.

Cell isolating regions 54 are formed on the upper surface of a p-type silicon substrate excluding transistor forming regions 51 and 52 in which basic blocks are to be formed. Gate insulating films 55 and 56 for nonvolatile memory cells are formed in the transistor forming regions 51 and 52 on the upper surface of the silicon substrate 53 by a LOCOS process.

A floating gate forming pattern 57 is formed over the gate insulating film 55 on the part of the transistor forming region 51 and over a portion of the cell isolating region 54a. At the same time, a floating gate forming pattern 58 is formed over the gate insulating film 56 on the part of the transistor forming regions 52 and over the cell isolating region 54b.

Insulating films 59 and 60 are formed over the floating gate forming patterns 57 and 58. Gate insulating films 61 and 62 for insulating the gates of enhancement mode transistors are formed on the silicon substrate in regions between the floating gate forming pattern 57 and the cell isolating region 54a and between the floating gate forming pattern 58 and the cell isolating region 54c.

A polycrystalline silicon film is formed entirely over the floating gate forming patterns 57 and 58, and the polycrystalline silicon film is subjected to a photolithographic process and an etching process to form word lines and floating gates 63 and 64. The word lines form control gates 65 and 66 on the floating gates 63 and 64 and form transfer gates on the gate insulating films 61 and 62. In forming the control gates 65 and 66, a first selector gate 69 and a second selector gate 70 are formed.

Source-drain regions 71 and 72 of a LDD construction having a LDD diffused layer, not shown, are formed on the silicon substrate 53 on the both sides of the floating gates 63 and 64 and the transfer gates 67 and 68. Drain regions 73 and 74 are formed on the silicon substrate 53 on the opposite side of the first selector gate 69 with respect to the control gates 65 and 66, and a source region 75 is formed on the silicon substrate on the opposite side of the control gates 65 and 66 with respect to the second selector gate 70.

Interlayer insulating film 76 is formed over the control gates 65 and 66, and contact holes 77 and 78 are formed in the interlayer insulating film 76 at positions corresponding to the drain regions 73 and 74. The drain regions 73 and 74 are connected through the contact holes 77 and 78 to data lines 79 and 80.

In this EEPROM, the nonvolatile memory cells and the enhancement mode transistors are formed contiguously. Therefore, it is difficult to control the LDD dose of the source-drain region of each transistor individually and hence the respective LDD densities of the transistors are the same. Accordingly, required characteristics of write operation and erase operation are the same. Then it is difficult to realize a suitable characteristic for each operation mode.

Furthermore, if the LDD diffused layer has a normal LDD dose, which is not sufficient for the LDD diffused layer of the nonvolatile memory cell, writing is impossible. If the LDD dose of the LDD diffused layer is increased beyond a normal dose to facilitate writing, the enhancement mode transistor malfunctions due to hot electron effect.

In fabricating this conventional EEPROM, portions of the gate insulating film on the opposite sides of the transfer gate are removed in forming the control gate and the transfer gate by etching and in removing portions of the gate insulating film on the opposite sides of the control gate and the transfer gate. Consequently, portions of the silicon substrate on the opposite sides of the transfer gates are etched to form grooves in the silicon substrate on the opposite sides of the transfer gate in forming the floating gate by etching the floating gate forming pattern, and thereby the transfer gate is formed in a so-called trench gate construction. Consequently, punch through occurs across the source and the drain of the transfer transistor. Moreover, it is impossible to secure sufficient transconductance gm and sufficient load driving ability $\beta$ due to offset Consequently, malfunction, such as delay in write operation or erase operation, occurs.

Furthermore, a threshold voltage $V_{thHigh}$ after writing, a supply voltage $V_{dd}$ must meet an inequality: $0 < V_{thHigh} < V_{dd}$. Normally the supply voltage $V_{dd}$ is 5 V, and hence $0 < V_{thHigh} < 5$ V. Accordingly, the threshold voltage $V_{thHigh}$ is, taking errors into consideration, in the range of $2 \pm 1$ V. If the supply voltaged $V_{dd}$ is a low voltage on the order of 3 V, the threshold voltage $V_{thHigh}$ exceeds the upper limit of the voltage range for the threshold voltage $V_{thHigh}$. Therefore, the threshold voltage $V_{thHigh}$ must be, taking errors into consideration, in the range of $1.5 \pm 0.5$ V, which is difficult to meet the need of the market for low-voltage operation.

Still further, if EEPROMs are fabricated for the threshold voltage $V_{thHigh}$ in such a narrow range, EEPROMs not meeting standards for the threshold voltage $V_{thHigh}$ increase to reduce the yield of the process. Thus, such EEPROMs are not suitable for mass production.

SUMMARY OF TEE INVENTION

It is an object of the present invention to provide a nonvolatile storage device capable of functioning stably for write and erase operation on a low-voltage power supply.

A plurality of nonvolatile memory cells formed by forming floating gates and control gates in layers are connected in series through source-drain regions to the output terminal and the grounding terminal for data lines. A channel forming region is formed on a gate insulating film formed over the control gates. Source-drain regions for thin-film transistors are formed on the opposite sides of the channel forming region so as to be connected to the source-drain regions of the nonvolatile memory cells. The control gates serve as the gates of the thin-film transistors.

In the nonvolatile storage device thus constructed, the source-drain regions of the nonvolatile memory cells and the source-drain regions of the thin-film transistors are formed separately. Therefore, conditions for the LDD diffused layer of the source-drain regions of the nonvolatile memory cells and those for the LDD diffused layer of the source-drain regions of the thin-film transistors can be controlled individually and hence the difference in characteristic between write operation and erase operation is eliminated. Consequently, the nonvolatile storage device is able to operate stably for writing data and erasing data without malfunction.

In erasing written data, the threshold voltage for the nonvolatile memory cells is equal to supply voltage, and the threshold voltage for the thin-film transistors is about 0 V. Accordingly, the characteristics of the nonvolatile storage device is dominated by the characteristics of the thin-film transistors. On the other hand in writing data in the nonvolatile storage device, the threshold voltage for the nonvolatile memory cells coincides with the negative supply voltage, and the threshold voltage for the thin-film transistors is equal to the threshold voltage in the erase operation. Accordingly, the characteristics of the nonvolatile storage device is dominated by the characteristics of the nonvolatile memory cells. Consequently, in the erase operation, the written data can be erased when the threshold voltage for the nonvolatile memory cells after writing becomes positive.

BRIEF DESCRIPTION OF TEE DRAWINGS

The above and other objects, features and advantages of the present invention will become more apparent from the following description taken in connection with the accompanying drawings, in which:

FIGS. 5A to 5K are sectional views of a work in successive steps of a method of fabricating the EEPROM of FIG. 3.

DETAILED DESCRIPTION OF THE PREFERRED EMBODIMENT

An EEPROM in a preferred embodiment according to the present invention is a flash EEPROM 1 provided with a plurality of NAND type basic blocks.

Figure 3:
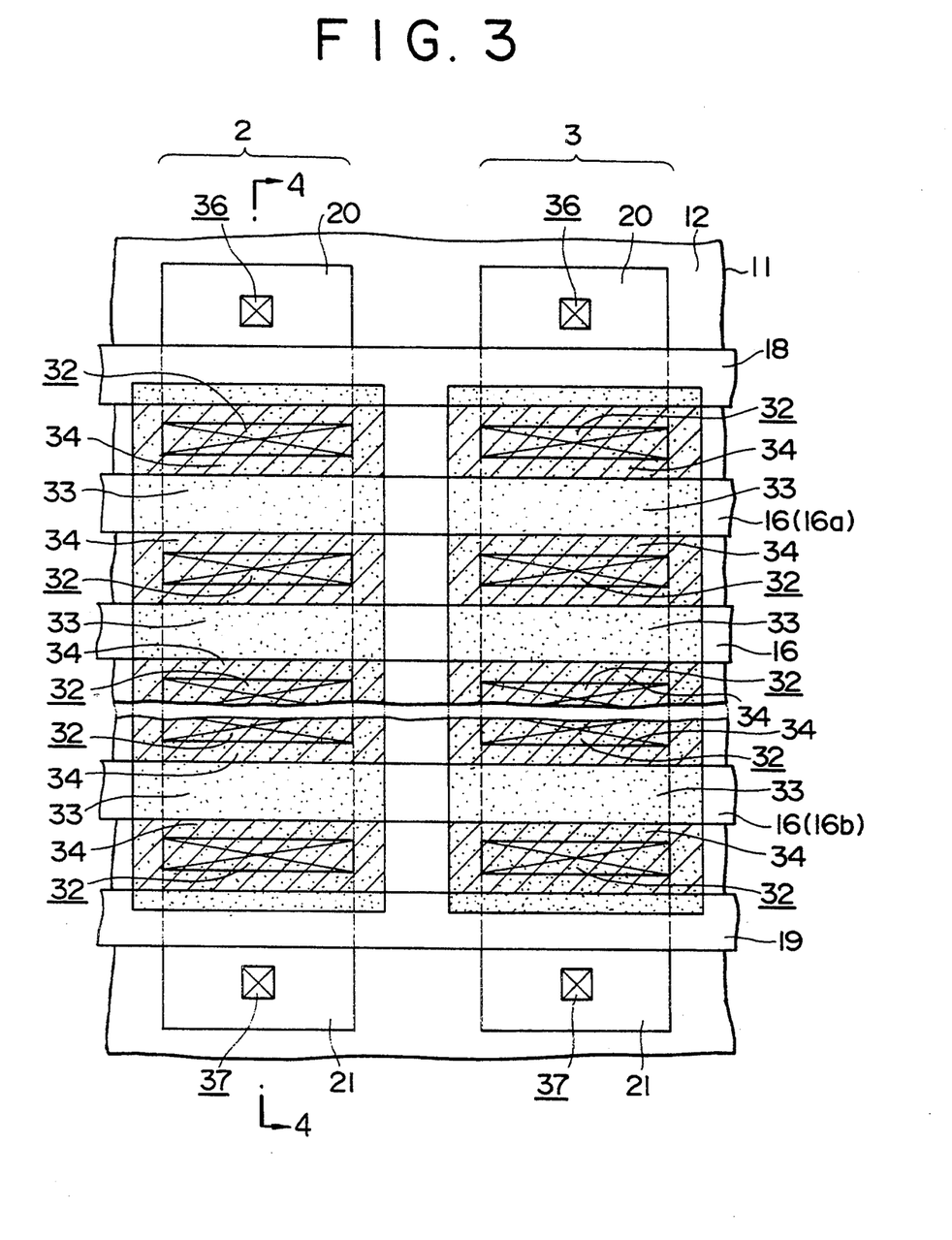
FIG. 3 is a plan-view showing the layout of the memory cells of an EEPROM in a preferred embodiment according to the present invention.
Figure 4:
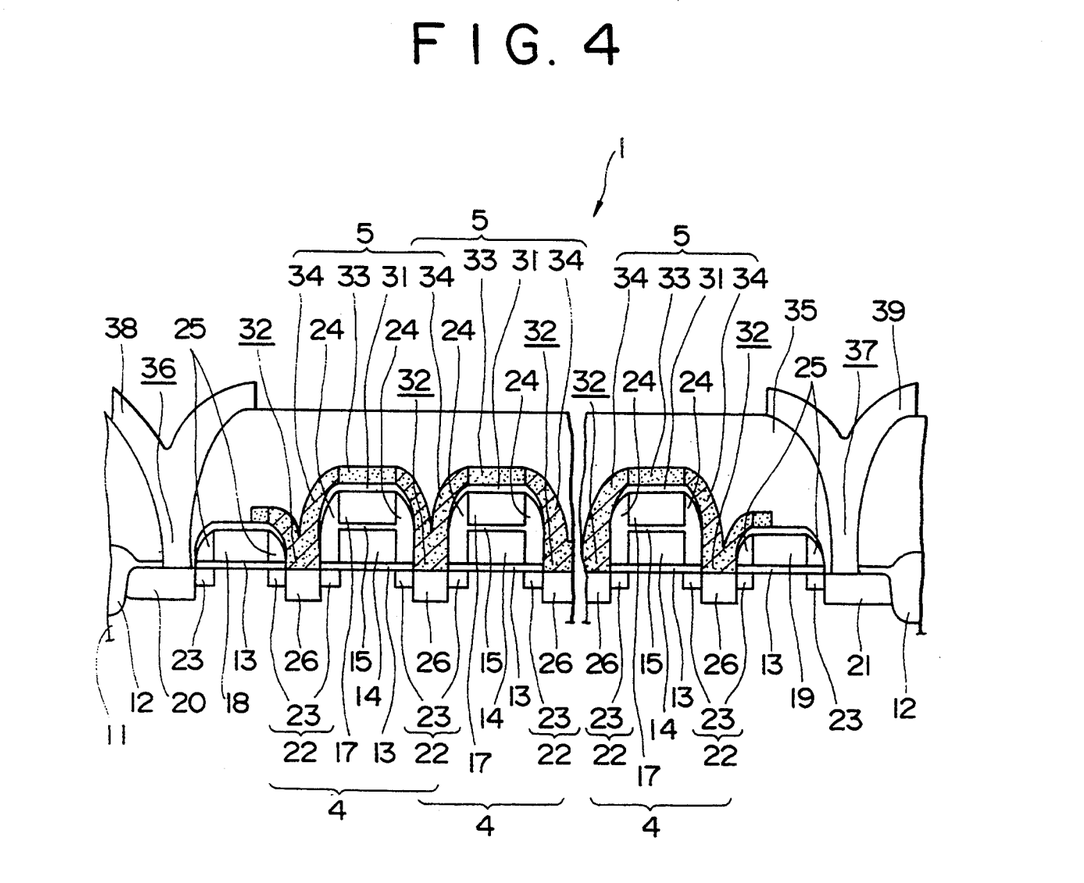
FIG. 4 is a schematic sectional view taken on line 4—4 in FIG. 3.

Referring to FIGS. 3 and 4, a cell isolating region 12 is formed over the surface of a semiconductor substrate 11 of p-type silicon excluding portions of the surface for transistor forming regions 2 and 3 for forming the basic blocks. Gate insulating films 13 of, for example, 20 nm in thickness are formed in portions of the surface of the semiconductor substrate 11 corresponding to the transistor forming regions 2 and 3. A plurality of floating gates 14, for example, eight floating gates, are formed on the gate insulating film 13. The floating gates 14 are formed of, for example, polycrystalline silicon. A gate layer insulating film 15 of, for example, 10 nm in thickness is formed so as to cover at least the floating gates 14.

Word lines 16 are formed on the gate layer insulating film 15 over the floating gates 14 across the transistor forming regions 2 and 3. Portions of the word lines 16 on the floating gates serve as control gates 17. The word lines 16 in the transistor forming regions 2 and 3 are connected to each other.

A first selector gate 18 and a second selector gate 19 are formed respectively on the opposite sides of the group of the word lines 16. Drain regions 20, which serve as output terminals for data lines, are formed on the opposite side of the group of the word lines 16 with respect to the first selector gate 18. Source regions 21, which serve as grounding terminals for the data lines, are formed on the opposite side of the group of the word lines 16 with respect to the second selector gate 19.

Source-drain regions 22 of a LDD construction are formed between the first selector gate 18 and the word line 16 (16a), between the adjacent word lines 16 and between the second selector gate 19 and the word line 16 (16b). Each source-drain region 22 of the LDD construction is formed by LDD diffused layers 23 formed by doping portions of the semiconductor substrate 11 on the opposite sides of each floating gate 14 with an impunity by ion implantation. The impunity dose of the LDD diffused layers 23 is greater than that of a normal diffused layer.

Side walls 24 are formed on the side surfaces of the floating gates 14 and the control gates 17. Side walls 25 are formed on the side surfaces of the first selector gate 18 and the second selector gate 19. Source-drain diffused layers 26 doped with an n-type impurity in a depth greater than that of the LDD diffused layers 23 are formed by ion implantation in the surface of the semiconductor substrate 11 between the adjacent side walls 24 and between the side wall 24 and the side wall 25 adjacent to the former. The LDD diffused layers 23 and the source-drain diffused layers 26 form source-drain regions 22.

Each control gate 27 is coated with a gate insulating film (silicon dioxide film) 31. Contact holes 32 are formed through the gate insulating films 31 at positions corresponding to the source-drain diffused layers 26. A polycrystalline silicon film is formed over the entire area of the gate insulating film 31 between the first selector gate 18 and the second selector gate 19. Portions of the polycrystalline silicon film corresponding to the control gates 17 are channel forming regions 33. Portions of the polycrystalline silicon film corresponding to the source-drain regions 22 are the source-drain regions 34 of thin-film transistors 5. The source-drain regions 33 are connected through the contact holes 32 to the source-drain diffused layers 26, respectively.

Thus, the gate insulating films 13, the floating gates 7.4, the gate insulating films 15, the control gates 17 and the source-drain regions 22 form nonvolatile transistors 4, and the control gates 17, the gate insulating films 31, the channel forming regions 33 and the source-drain regions 34 from thin film transistors 5, which serve as transfer transistors, in the transistor forming regions 2 and 3.

An interlayer insulating film 35, such as a silicon dioxide film, is formed entirely over the thin-film transistors 5 by, for example, a chemical vapor deposition process, contact holes 36 for output terminals are formed through the interlayer insulating film 35 and the gate insulating film 31 at positions corresponding to the drain regions 20, and contact holes 37 for grounding terminals are formed through the interlayer insulating film 35 and the gate insulating film 31 at positions corresponding to the source regions 21. Data lines 38 and 39, i.e., conductive films such as aluminum alloy films, are formed so as to be connected through the holes 36 and 37 respectively to the drain regions 20 and the source regions 21.

The operation of the EEPROM 1 will be described hereinafter.

In erasing data written in the EEPROM 1, a voltage sufficiently higher than that of the diffused source regions 21 is applied to the control gates 17 to inject electric charge from the diffused drain regions 20 through the gate insulating films 13 into the floating gates 14 by tunnel effect.

In writing data in the EEPROM 1, the control gates 17 are grounded and a high voltage is applied to the diffused drain regions 20 by reverse tunnel effect.

The impurity dose of the LDD diffused layer 23 of the EEPROM 1 can independently be determined, and hence it is possible to form the LDD diffused layer 23 in an impurity dose higher than a normal impurity dose. Accordingly, the LDD diffused layers 23 has high ability to carry current and hence data can easily be written.

In erasing the data written in the EEPROM 1, the threshold voltage for the nonvolatile memory cells 4 is equal to the supply voltage, for example, 3 V, and the threshold voltage for the thin film transistors 5 is substantially 0 V. Accordingly, the characteristics of the EEPROM 1 is dominated by the characteristics of the thin-film transistors 5. In writing data in the EEPROM 1, the threshold voltage for the nonvolatile memory cells 4 becomes negative, for example, −3 V, and the threshold voltage for the thin-film transistors 5 is equal to the threshold voltage for the same in the erase operation. Accordingly, the characteristics of the EEPROM 1 is dominated by the nonvolatile memory cells 4. Therefore, the data written in the EEPROM 1 can be erased by adjusting the threshold voltage $V_{thHigh}$ for the nonvolatile memory cells 4 after writing to a voltage not lower than 0 V.

Thus, the EEPROM 1 can be powered by a low-voltage power supply having an output voltage, for example, on the order of 3 V. Since the threshold voltage $V_{thHigh}$ may be a voltage in a wide voltage range, the yield of the process of fabricating the EEPROM 1 is improved.

Since the thin-film transistors 5 are formed over the nonvolatile memory cells 4, the thin-film transistors 5, which function as transfer transistors, are not formed in a trench gate construction and punch through does not occur in the channel forming regions 33 of the thin-film transistors 5. Furthermore, since there is no offset, it is possible to secure sufficient transconductance gm and sufficient load driving ability $\beta$. Therefore, malfunction, such as delayed timing of write operation or erase operation, does not occur.

A method of fabricating the EEPROM 1 will be described hereinafter with reference to FIGS. 5A to 5K on an assumption that the EEPROM 1 is formed in the transistor forming region 2.

Figure 5A:
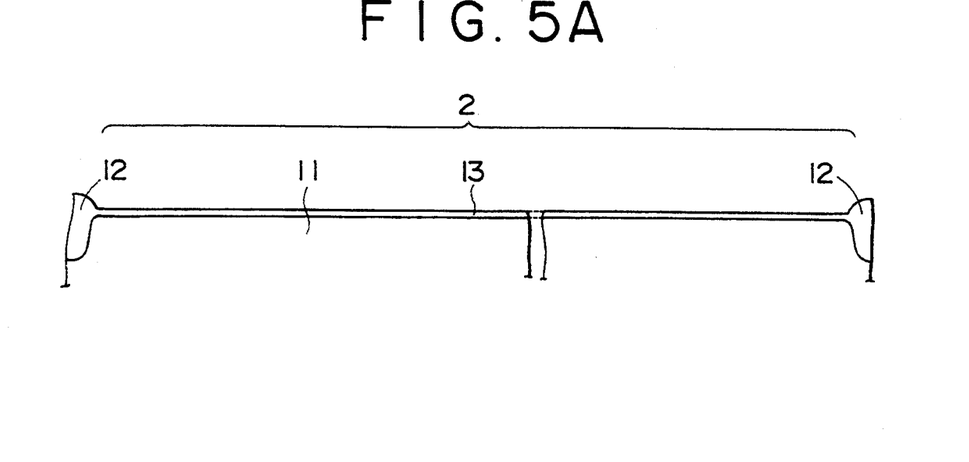

Referring to FIG. 5A, a cell isolating region 12 is formed by a LOCOS process on the surface of a semiconductor substrate 11 formed of p-type silicon excluding a transistor forming region 2. A silicon dioxide film, not shown, formed by a LOCOS process and a silicon nitride film, not shown, are etched. Then, a gate insulating film 13 (silicon dioxide film) is formed, for example, by a thermal oxidation process in the transistor forming region 2 on the surface of the semiconductor substrate 11. The thickness of the gate insulating film 13 is, for example, 20 nm.

Figure 5B:
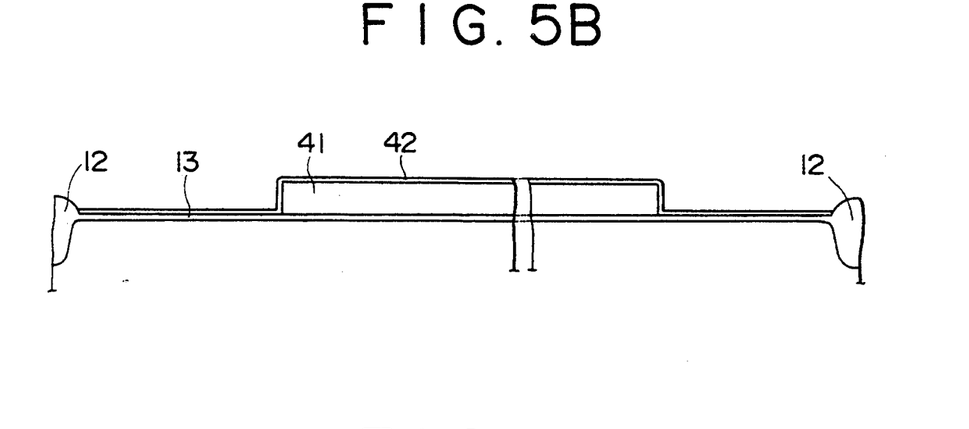

Referring to FIG. 5B, a polycrystalline silicon film is deposited over the entire cell isolating region 12 by, for example, a chemical vapor deposition process. Then, a pattern 41 of the polycrystalline silicon film for forming floating gates, partially covering the gate insulating film 13 is formed by subjecting the polycrystalline silicon film to, for example, a photolithographic process and an etching process. The pattern 41 is not formed over regions in which selector gates 18 and 19 (FIG. 3) are to be formed. Then, a silicon dioxide film 42 is formed so as to cover at least the pattern 41 of the polycrystalline silicon by, for example, a chemical vapor deposition process. The thickness of the silicon dioxide film 42 is, for example, 1 nm.

Figure 5C:
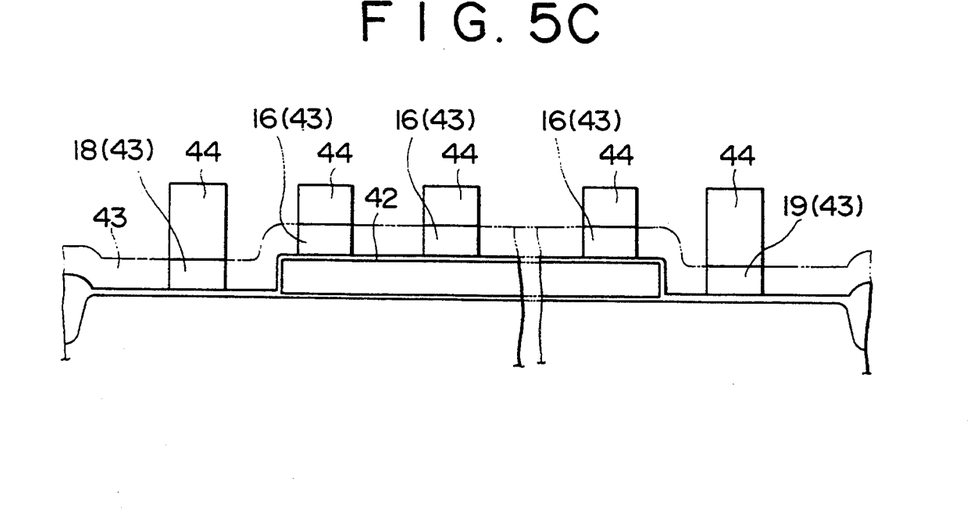

Referring to FIG. 5C, a polycrystalline silicon film 43 for control gates is formed over the entire surface of the silicon dioxide film 42 by, for example, a chemical vapor deposition process. Then, a resist mask 44 for forming word lines 16, a first selector gate 18 and a second selector gate 19 is formed by, for example, a photolithographic process on the polycrystalline silicon film 43, and then, portions of the polycrystalline silicon film 43 demarcated by an alternate long and two short dashes line are etched by using the resist mask 44 to form the word lines 16, the first selector gate 18 and the second selector gate 19. The silicon dioxide film 42 and the pattern 41 of the polycrystalline silicon film are etched also by using the resist mask 44.

Figure 5D:
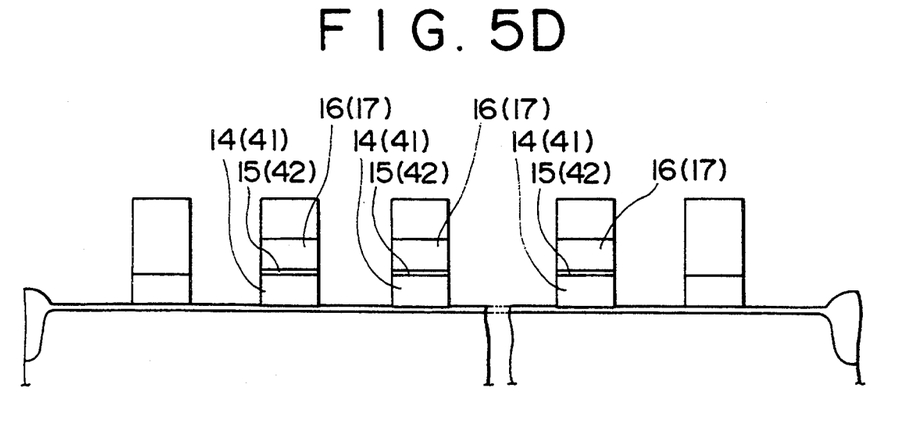

Thus, as shown in FIG. 5D, gate insulating films 15 is formed by the silicon dioxide film 42, and the floating gates 14 are formed by the pattern 41 of the polycrystalline silicon film. Portions of the word lines 16 corresponding to the floating gates 14 serve as control gates 17.

Figure 5E:
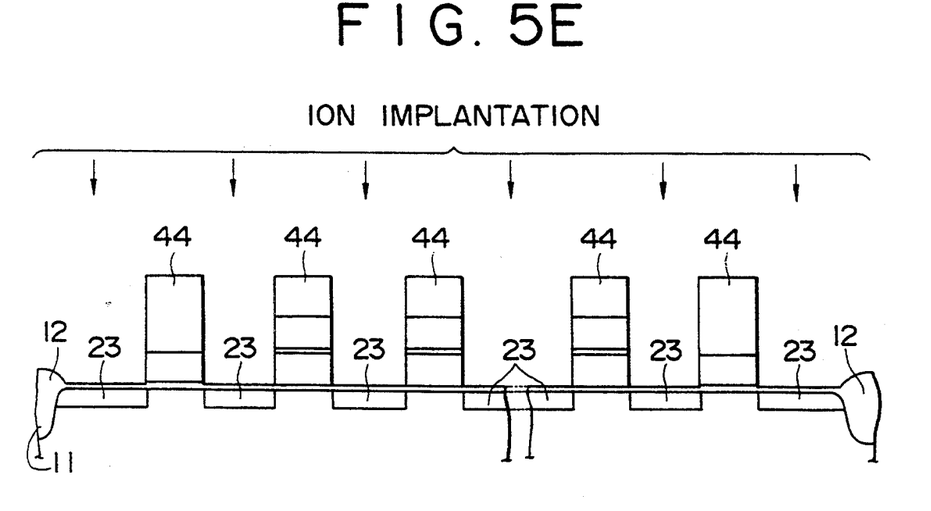

Then, as shown in FIG. 5E, LDD diffused layers 23 are formed by implanting ions of an n-type impurity in the surface of the semiconductor substrate 11 at a dose greater than a normal dose by using the resist mask 44. Then, the resist mask 44 is removed by ashing or the like.

Figure 5F:
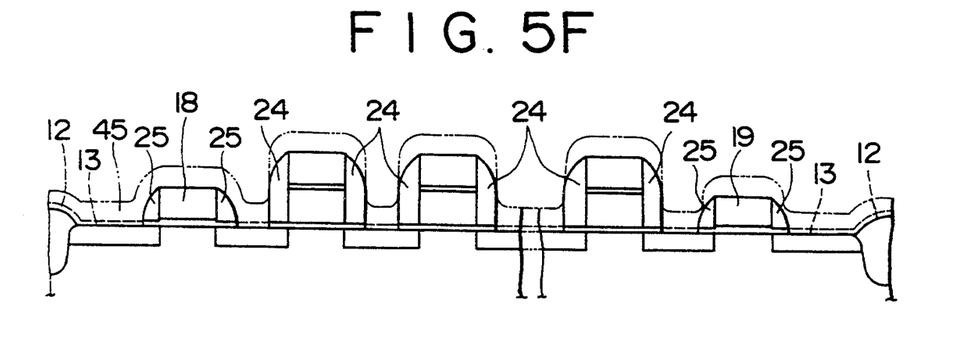

Then, as shown in FIG. 5F, a silicon dioxide film 45 for forming side walls is deposited over the entire surface of the work by, for example, a chemical vapor deposition process. Then, portions of the silicon dioxide film demarcated by alternate long and two short dashes lines are removed by anisotropic etching to form side walls 24 over the side surfaces of the floating gates 14, the word lines 16, the control gates 17, the first selector gate 18 and the second selector gate 19. Portions of the gate insulating film 13 indicated by broken lines and portions of the cell isolating region 12 indicated by broken lines corresponding to the etched portions of the silicon dioxide film 45 are removed also in etching the silicon dioxide film 45.

Figure 5G:
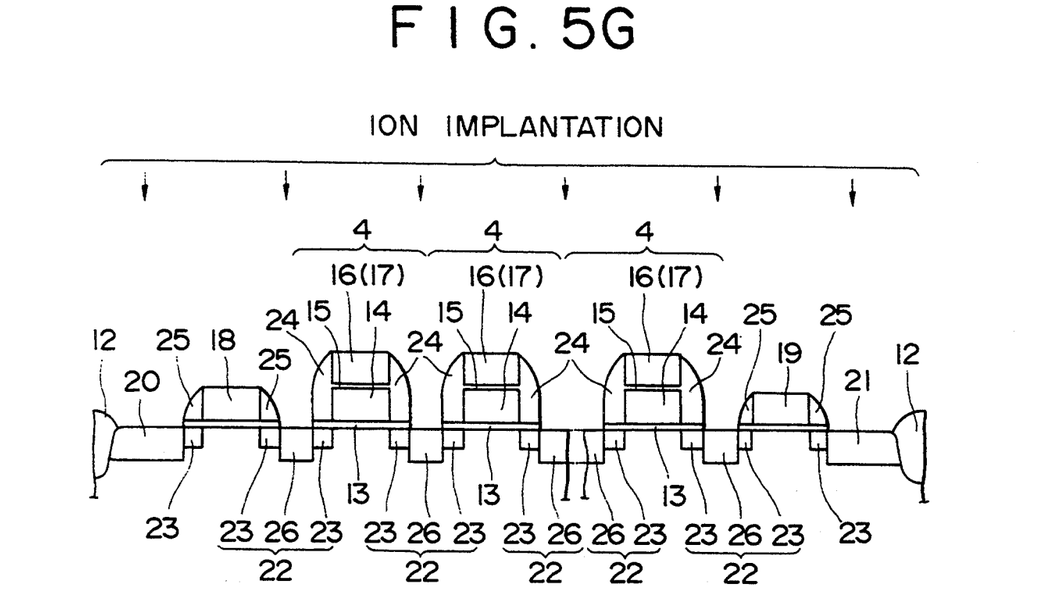

Subsequently, as shown in FIG. 5G, an n-type impunity, such as arsenic (As), is diffused in the surface of the semiconductor substrate 11 to form a diffused drain layer 20, a diffused source layer 21 and diffused source-drain layers 26 in a depth greater than that of the LDD diffused layers 23 by ion implantation using the cell isolating regions 12, the word lines 16 including the control gates 17, the first selector gate 18, the second selector gate-19 and the side walls 24 and 25 as masks. Each diffused source-drain region 26 and the LDD diffused layers 23 on the opposite sides of the source-drain region 26 form a source-drain region 22. Each gate insulating film 13, the floating gate 14 on the gate insulating film 13, the gate insulating film 15 on the floating gate 14, the control gate 17 on the gate insulating film 15, and the source-drain regions 22 on the opposite sides of the floating gate 14 form a nonvolatile memory cell 4.

Figure 5H:
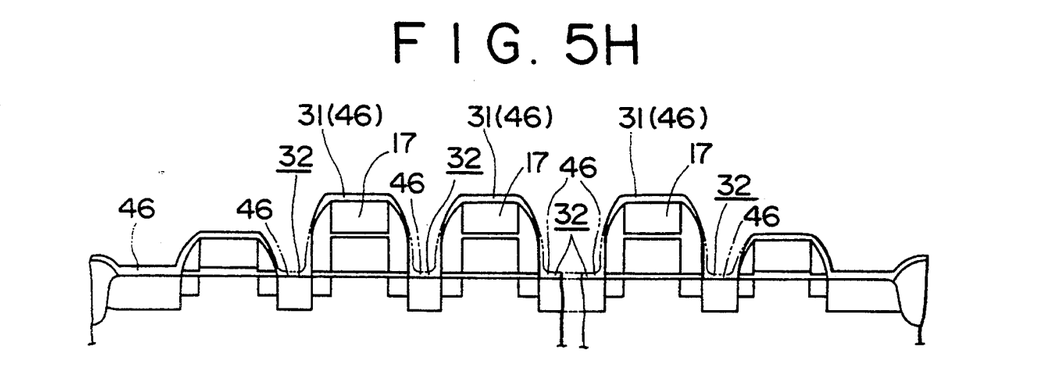

Then, as shown in FIG. 5H, a silicon dioxide film 46 is formed over the entire surface of the work by a chemical vapor deposition process. Portions of the silicon oxide film 46 corresponding to the control gates 17 serve as gate insulating films 31 for thin-film transistors. Then, portions of the silicon dioxide film 46 over the source-drain regions 22 demarcated by alternate long and two short dashes lines are removed by a photolithographic process and an etching process to form contact holes 32 on the diffused source-drain layers 26.

Figure 5I:
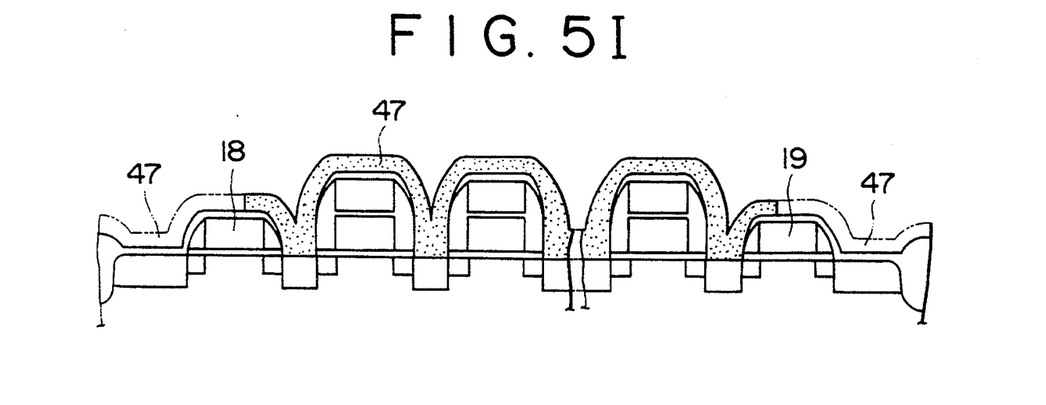

Then, as shown in FIG. 5I, a polycrystalline silicon film 47 is formed over the entire surface of the work by a chemical vapor deposition process, and then portions of the polycrystalline silicon film 47 demarcated by alternate long and two short dashes lines other than a portion between the first selector gate 18 and the second selector gate 19 are removed by a photolithographic process and an etching process.

Figure 5J:
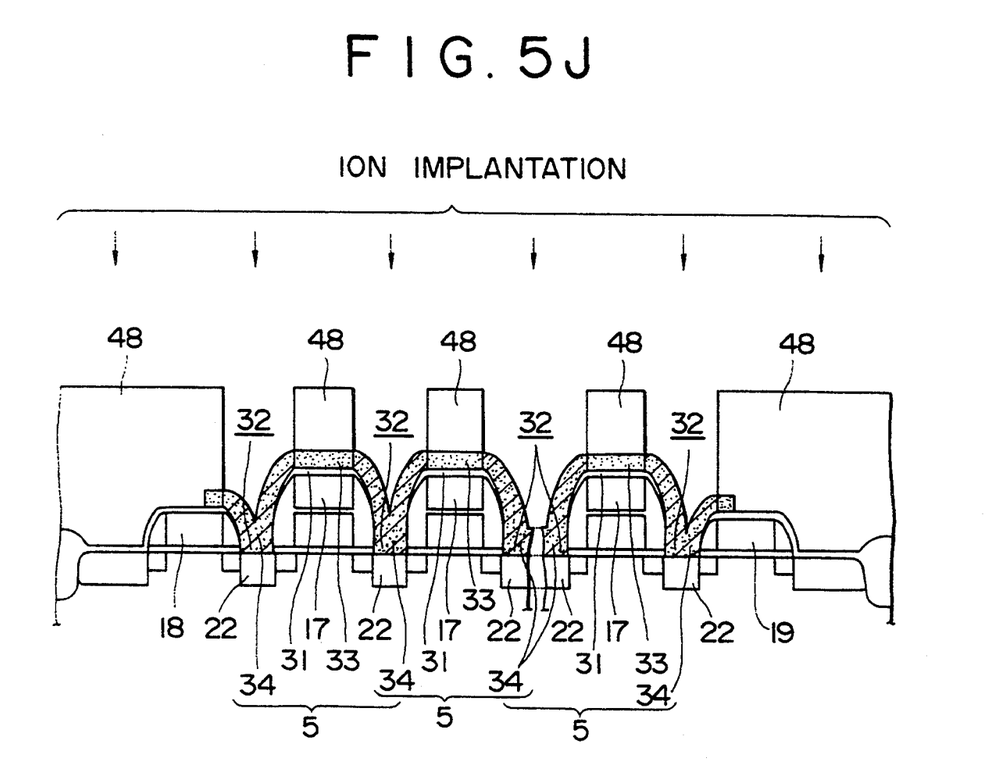

Subsequently, as shown in FIG. 5J, a resist film is formed over the entire surface of the polycrystalline silicon film 47, and then the resist film is subjected to exposure and developing to form a mask 48 over the first selector gate 18, the second selector gate 19 and the control gates 17 for ion implantation. Then, arsenic (As), i.e., an n-type impunity, is diffused in the polycrystalline silicon film 47 by ion implantation to form source-drain regions 34. The source-drain regions 34 are connected through the contact holes 32 to the source-drain regions 22 of memory transistors. Portions of the polycrystalline silicon film 47 corresponding to the control gates 17 serve as channel forming regions 33. The control gate 17, the gate insulating film 31 on the control gate 17, the channel forming region 33 on the gate insulating film 31, and the source-drain regions 34 on the opposite sides of the channel forming regions 34 form a thin-film transistor 5. The mask 48 is removed by ashing.

Figure 5K:
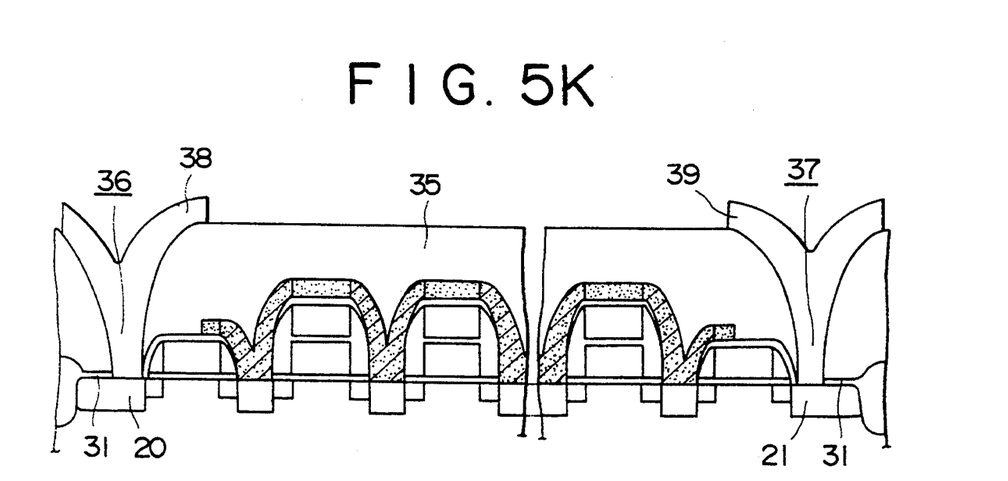

Then, as shown in FIG. 5K, an interlayer insulating film 35 of silicon dioxide (SiO$_2$) is formed over the entire surface of the work by a chemical vapor deposition process, and then a contact hole 36 for an output terminal is formed through the gate insulating film 31 and the interlayer insulating film 35 at a position corresponding to the drain region 20, and a contact hole 37 for a grounding terminal is formed through the gate insulating film 31 and the interlayer insulating film 35 at a position corresponding to the source region 21. Data lines 38 and 39 are formed on the interlayer insulating film 34 so as to be connected to the drain region 20 and the source region 21 through the contact holes 36 and 37, respectively.

As is apparent from the foregoing description, according to the present invention, a thin-film transistor having a source-drain region connected to the source-drain region of a nonvolatile memory cell, and a gate serving also as the control gate of the nonvolatile memory cell is formed nn the same nonvolatile memory cell. Accordingly, conditions for the LDD diffused layer of the nonvolatile memory cell and those for the source-drain region of the thin film transistor can individually be determined. Therefore, the EEPROM is capable of stably functioning for write operation and erase operation. Since the threshold voltage after write operation need not be reduced to a voltage not higher than the supply voltage, the EEPROM is able to operate on a low-voltage power supply. The stacked arrangement of the thin-film transistors and the nonvolatile memory cells enables the EEPROM to be formed in an increased degree of integration.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. An electrically erasable and programmable semiconductor memory array comprising:
  a semiconductor substrate of a first conductivity type, parallel bit lines provided above said substrate, and
  rewritable memory cells connected to said bit lines through a first transfer transistor, said memory cells comprising NAND cell blocks each of which has a series array of memory cell transistors, each of said memory transistors having a second transfer transistor of enhancement type,
  wherein said memory transistor has semiconductor regions of a second conduction type opposite to said first conductivity type, a first gate insulating film formed on said semiconductor substrate in regions between said semiconductor regions of said second conductivity type, a floating gate electrode formed over said first gate insulating film, a second gate insulating film formed over said floating gate electrode, a control gate electrode formed over said second gate insulating film, a third gate insulating film formed over said second conductive film, and a semiconductor film for forming said second transfer transistor,
  said second transfer transistor having a channel region above said floating gate electrode and a source or drain region above said semiconductor region and said control gate as a gate electrode in common with said memory transistor,
  said semiconductor film being formed over said third gate insulating film and connected through contact holes to said semiconductor regions of said second conduction type.

* * * * *